(12) United States Patent
Lenz

(10) Patent No.: US 7,279,977 B2
(45) Date of Patent: Oct. 9, 2007

(54) INTEGRATED CIRCUIT WITH RESISTIVE NETWORK HAVING REDUCED MISMATCH

(75) Inventor: Kuno Lenz, Voreppe (FR)

(73) Assignee: STMicroelectronics SA, Montrague (FR)

(*) Notice: Subject to any disclaimer, the term of this patent is extended or adjusted under 35 U.S.C. 154(b) by 39 days.

(21) Appl. No.: 11/098,005

(22) Filed: Apr. 1, 2005

(65) Prior Publication Data
US 2006/0017508 A1    Jan. 26, 2006

(30) Foreign Application Priority Data
Apr. 2, 2004 (FR) .................................. 04 03500

(51) Int. Cl.
*H03G 3/12* (2006.01)
(52) U.S. Cl. ..................... 330/282; 330/86; 330/307
(58) Field of Classification Search .............. 330/9, 330/86, 278, 279, 282, 307
See application file for complete search history.

(56) References Cited

U.S. PATENT DOCUMENTS 4,855,685 A * 8/1989 Hochschild ................. 330/282
5,905,427 A    5/1999 Hamasaki et al. .......... 338/320

FOREIGN PATENT DOCUMENTS

GB    2 039 154    7/1980

OTHER PUBLICATIONS

J. Paul A. Van Der Wagt et al., "A Layout Structure for Matching Many Integrated Resistors", IEEE Transactions on Circuits and Systems—I: Regular Papers, vol. 51, No. 1, Jan. 2004, XP-002306191, pp. 186-190.
Yu Lin et al., "Yield Enhanced Layout Strategies for Ratio-Critical Analog Circuits", The 2002 45th Midwest Symposium on Cicuits and System, Conference Proceedings, Tulsa OK, XP010635218, pp. I-332 thru I-335.
French Preliminary Search Report dated Nov. 17, 2004 for French Application No. 04 03500.

* cited by examiner

*Primary Examiner*—Khanh Van Nguyen
(74) *Attorney, Agent, or Firm*—Lisa K. Jorgenson; Jose Gutman; Fleit Kain Gibbons Gutman Bongini & Bianco P.L.

(57) ABSTRACT

An integrated circuit includes a resistive circuit with reduced mismatch that includes a primary resistive network with several main resistances (Rp) each having the same theoretical main value. It also includes an auxiliary resistance (Rau) having an auxiliary theoretical resistive value equal to the product or to the quotient of the theoretical main resistive value by $\sqrt{2}$. All these resistances are connected together so as to attribute a theoretical overall resistive value to the primary resistive network equal to the theoretical auxiliary resistive value.

11 Claims, 4 Drawing Sheets

INTEGRATED CIRCUIT WITH RESISTIVE NETWORK HAVING REDUCED MISMATCH

CROSS-REFERENCE TO RELATED APPLICATION

This application is based upon and claims priority from prior French Patent Application No. 04 03500, filed on Apr. 2, 2004, the entire disclosure of which is herein incorporated by reference.

BACKGROUND OF THE INVENTION

1. Field of the Invention

The invention relates to integrated circuits with resistive networks and more particularly to those having a reduced mismatch. The invention can be advantageously applied to, but is not limited to, the gain control, in particular in steps of three decibels, of variable-gain amplifiers.

2. Description of the Related Art

The gain of the amplifier is defined by a ratio of resistances formed by a resistive circuit in the feedback loop of the operational amplifier and a resistive circuit connected in the input of this operational amplifier.

The resistances used for these circuits can exhibit a significant mismatch which is detrimental to the precision of the gain. The mismatch results from differences in values that exist between the various resistances of the circuit, for example the dimensional tolerances resulting from their fabrication process on the integrated circuit.

Accordingly, there exists a need for overcoming the disadvantages of the prior art as discussed above.

SUMMARY OF THE INVENTION

The invention aims to provide a solution to this problem discussed above.

An object of the invention is to propose, in a general manner, a resistive circuit having a reduced mismatch, and in particular a resistive circuit having a specific resistive value allowing, for example, a gain control in steps of 3 dB.

An embodiment of the invention is therefore an integrated circuit comprising a resistive circuit with reduced mismatch that comprises a primary resistive network with several main resistances each having the same theoretical main value, for example a value of unity. It also comprises an auxiliary resistance having an auxiliary theoretical resistive value equal to the theoretical main resistive value multiplied or divided by $\sqrt{2}$. All these resistances are connected together so as to attribute a theoretical overall resistive value to the primary resistive network equal to the theoretical auxiliary resistive value.

The particular arrangement of the resistances in combination with the use of several theoretically identical resistances allows the overall mismatch of the circuit to be minimized, by especially minimizing the impact of the mismatch of the auxiliary resistance.

Furthermore, the ratio $\sqrt{2}$ allows a gain control of an amplifier in steps of around 3 dB ($20 \times \log(\sqrt{2})$), the reduction in mismatch then offering a good precision in this control.

According to one embodiment of the invention, the integrated circuit comprises a primary resistive network that comprises a main resistance in series with a subnetwork having three branches mounted in parallel, each of the branches of the subnetwork comprising a main resistance. In addition, one of the branches comprises, aside from a main resistance, an auxiliary resistance mounted in series with the main resistance. The theoretical auxiliary resistive value (and therefore the theoretical overall resistive value) is equal to the theoretical main resistive value multiplied by $\sqrt{2}$.

The aforementioned network here allows the gain to be controlled in steps of +3 dB.

According to another embodiment of the invention, the integrated circuit comprises a primary resistive network that comprises a main resistance in parallel with a subnetwork formed by three main resistances mounted in series. In addition, the subnetwork also comprises an auxiliary resistance, mounted in parallel with one of the main resistances of the subnetwork. The theoretical auxiliary resistive value is equal to the theoretical main resistive value divided by $\sqrt{2}$.

The aforementioned network here allows the gain to be controlled in steps of −3 dB.

The auxiliary resistance can simply be formed by a line of polysilicon, for example having dimensions that directly attribute it with its theoretical value equal to $\sqrt{2}$ Ru or Ru/$\sqrt{2}$, where Ru denotes the resistive value of the main resistance.

Nevertheless, in order to further minimize the contribution of the auxiliary resistance to the overall mismatch of the circuit, the auxiliary resistance of the integrated circuit can advantageously be formed, at least once, by an auxiliary resistive network that is identical to a primary resistive network.

According to one embodiment of the invention, the resistive circuit of the integrated circuit can comprise several primary resistive networks connected in parallel and/or in series.

According to a general feature of the invention, the integrated circuit also comprises a variable-gain operational amplifier whose negative feedback loop comprises at least one resistive circuit with reduced mismatch, switching means capable of activating or deactivating the various primary resistive networks of the resistive circuit, and gain control means capable of controlling the switching means as a function of the desired value of gain.

BRIEF DESCRIPTION OF THE DRAWINGS

Other advantages and features of the invention will become apparent upon examination of the detailed description of the non-limiting embodiments of the invention, and of the appended drawings, in which.

DETAILED DESCRIPTION

Figure 1:
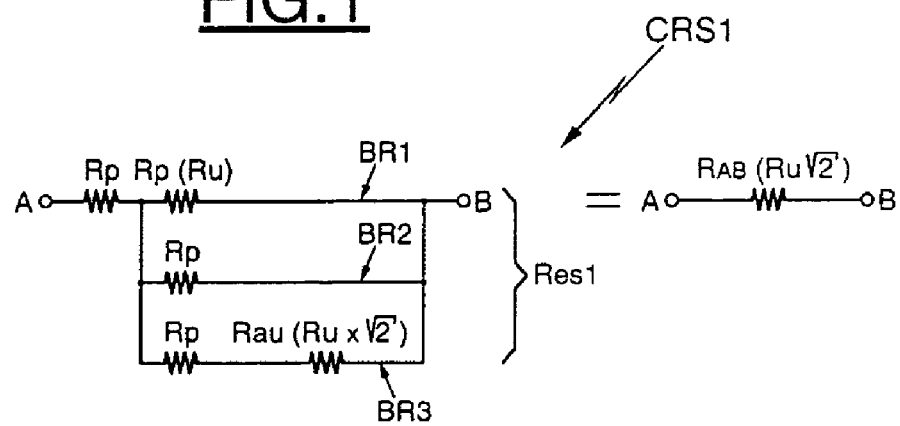
FIG. 1 illustrates schematically an exemplary embodiment of an integrated circuit according to the invention.

In FIG. 1 the reference Res1 represents an example of a primary resistive network according to the invention.

This primary resistive network forms part of a resistive circuit CRS1 which can be fabricated in an integrated fashion within an integrated circuit. An integrated circuit can comprise a circuit supporting substrate that supports a circuit disposed thereon.

The resistive network Res1 comprises four main resistances Rp between the terminals A and B, all having the same theoretical main value Ru.

These resistances can be formed within an integrated circuit by a polysilicon line according to a process known to those skilled in the art.

For this network Res1, a main resistance Rp is connected in series with a subnetwork composed of three parallel distinct branches BR1, BR2 and BR3. Each of these branches of the subnetwork comprises a main resistance Rp.

In one of the branches of the subnetwork, in this example the third branch BR3, an auxiliary resistance Rau is mounted in series with the main resistance Rp of the branch BR3. Connecting the auxiliary resistance Rau into any one of the three branches of the subnetwork would be equivalent.

The theoretical value of the auxiliary resistance Rau is equal to the theoretical value Ru of a main resistance Rp multiplied by $\sqrt{2}$, namely $\sqrt{2}$ Ru.

The theoretical overall resistive value of the resistive network Res1 is equal to $\sqrt{2}$ Ru, as represented in the right-hand part of FIG. 1 by the equivalent resistance $R_{AB}$.

The auxiliary resistance Rau can be directly formed from a non-unity resistance, for example also using a line of polysilicon whose length will be equal to that of the polysilicon line for the main resistance Rp multiplied by $\sqrt{2}$, the widths of the two lines being identical.

The total mismatch of the resistive network Res1 may be expressed by the following formula:

$$\left(\frac{\sigma(R_{AB})}{R_{AB}}\right)^2 = \left(\lambda_1 \frac{\sigma(Rp)}{Rp}\right)^2 + \left(\lambda_2 \frac{\sigma(Rau)}{Rau}\right)^2.$$

The coefficients $\lambda_1$ and $\lambda_2$ are the respective contributions of the resistances Rp and Rau to the resistive network Res1, and $\sigma$ denotes the standard deviation.

The arrangement of the resistive network Res1 allows the contribution of the auxiliary resistance Rau in the total mismatch to be greatly reduced. Indeed, in this example, the coefficients $\lambda_1$ and $\lambda_2$ have respective values of 73% and 3%.

In a worst-case scenario, the standard deviation of the resistance Rau (in the case where Rau is a non-unity resistance) is:

$$\left(\frac{\sigma(Rau)}{Rau}\right) = 30\%.$$

The worst-case scenario is that where there is no match with the resistance Rp. Indeed, in the case of a non-unity resistance, no match is guaranteed by the technology. The case considered here is the limiting case for 0.25 μm bicmos technology.

The contribution of the resistance Rau then becomes:

$$\lambda_2 \frac{\sigma(Rau)}{Rau} = 0.03 \times 0.3 = 0.9\%.$$

Furthermore, for a main resistance Rp having the dimensions with a width of 4 μm and a length of 18.4 μm, the standard deviation is:

$$\frac{\sigma Rp}{Rp} = 1.4\%$$

(again for the case of 0.25 μm bicmos technology). The contribution of the resistances Rp then becomes:

$$\lambda_1 \frac{\sigma(Rp)}{Rp} = 0.73 \times 0.014 = 1\%.$$

Finally, the total mismatch of the resistance $R_{AB}$ is:

$$\left(\frac{\sigma(R_{AB})}{R_{AB}}\right)^2 = (0.73 \times 0.014)^2 + (0.03 \times 0.30)^2 = (0.0136)^2.$$

It will therefore be noted not only that the contribution of Rau in the total mismatch is small and can be neglected, but that the total mismatch of the network whose resistive value is $\sqrt{2}$ Ru is much smaller than that of a single resistance of the same value $\sqrt{2}$ Ru, since the standard deviation of such a resistance is 0.3 (30%).

Figure 2:
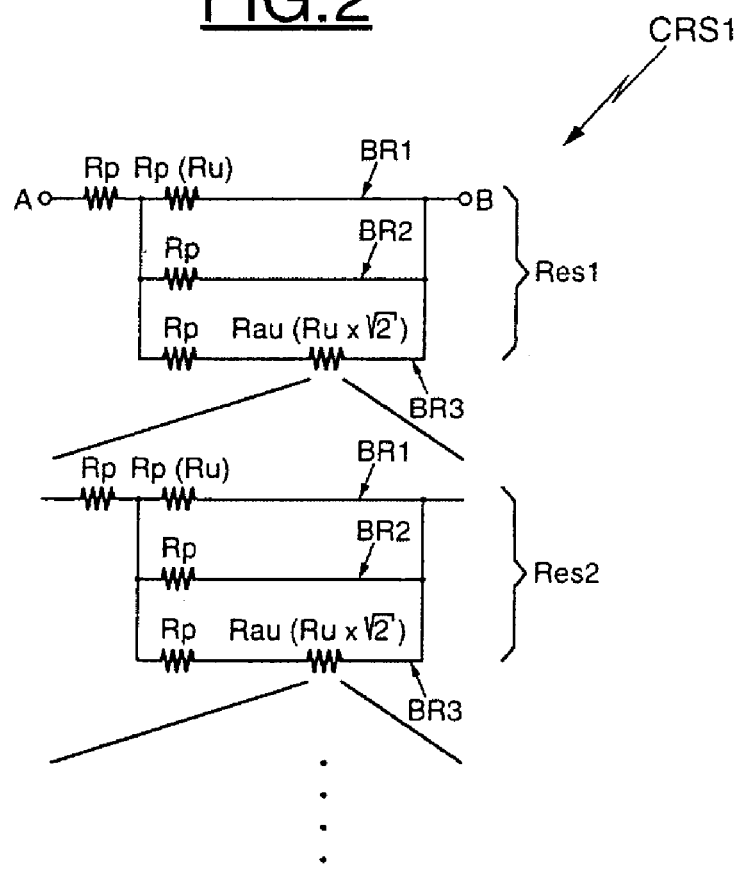
FIG. 2 illustrates schematically one variant of an integrated circuit according to the invention.

In addition, it is possible to further reduce the contribution of this auxiliary resistance Rau in the total mismatch by replacing the non-unity auxiliary resistance Rau by an auxiliary network Res2 that is identical to Res1, as can be seen in FIG. 2. Indeed, the resistive value of the auxiliary network Res2 is equal to $\sqrt{2}$ Ru.

It will have been noted by those skilled in the art that, in this case, the contribution of the resistance Rau in the total mismatch of the complete circuit CRS1 is then 0.09%. This operation can be carried out several times so as to further reduce the contribution of the resistance Rau in the total mismatch.

Figure 3:
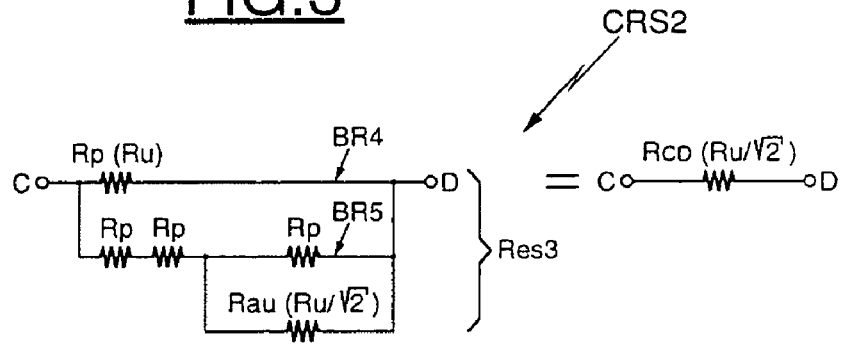
FIG. 3 illustrates schematically a second exemplary embodiment of an integrated circuit according to the invention.

FIG. 3 shows a second primary resistive network Res3 according to the invention.

This primary resistive network forms part of a resistive circuit CRS2 which can be fabricated in an integrated fashion within an integrated circuit.

In a similar manner as for the resistances of the network Res1, the resistances of the network Res3 can be formed within an integrated circuit by a line of polysilicon according to a process known by those skilled in the art.

The resistive network Res3 comprises four main resistances Rp between the terminals C and D having all the same theoretical main value Ru.

The network Res3 comprises two parallel branches BR4 and BR5. The first branch BR4 comprises a main resistance Rp and the second branch BR5 a subnetwork of three other main resistances Rp. An auxiliary resistance Rau is also provided in parallel with one of the resistances Rp (in this example, the third resistance Rp of the second branch BR5). Mounting the auxiliary resistance Rau in parallel with any one of the three resistances Rp of the branch BR5 would be equivalent.

The theoretical value of the auxiliary resistance Rau is equal to the theoretical value Ru of a main resistance Rp divided by $\sqrt{2}$, namely Ru/$\sqrt{2}$.

The theoretical overall resistive value of the resistive network Res3 is equal to Ru/$\sqrt{2}$, as shown in the right-hand part of FIG. 3 by the equivalent resistance $R_{CD}$.

In an analogous way to the network Res1, the auxiliary resistance Rau can be directly formed from a non-unity resistance, for example also using a line of polysilicon whose length will be equal to that of the polysilicon line for the main resistance Rp divided by √2, the widths of the two lines being identical.

In an analogous manner to that explained with reference to FIG. 1, the total mismatch is reduced and the contribution of the auxiliary resistance Rau in this network is minimal.

Figure 4:
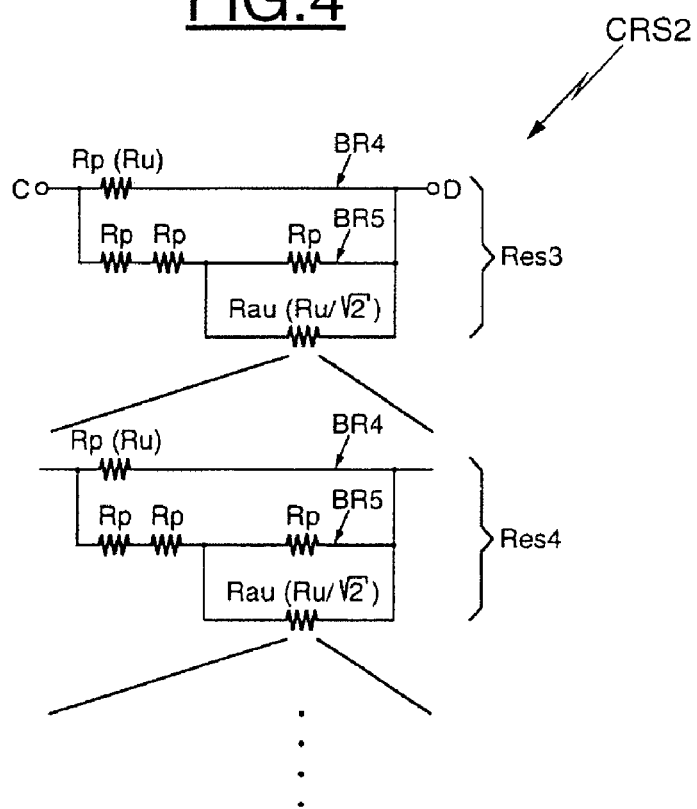
FIG. 4 illustrates schematically one variant of an integrated circuit according to the invention.

Here again, it is possible to use an auxiliary resistive network Res4 that is identical to the resistive network Res3 in order to form the auxiliary resistance Rau, so as to again reduce the contribution of the resistance Rau, as illustrated in FIG. 4.

It is possible to link the primary resistive networks Res1 and Res3 in series or in parallel. Indeed, it will be noted that the use of two resistances $R_{CD}$ in series is equivalent to a resistance $R_{AB}$ of value √2.

Similarly, the use of two resistances $R_{AB}$ in parallel is equivalent to a resistance $R_{CD}$ of value 1/√2.

Figure 5:
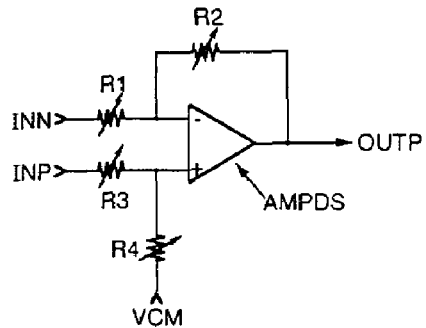
FIGS. 5 to 8 illustrate schematically exemplary applications of resistive networks according to the invention.
Figure 6:
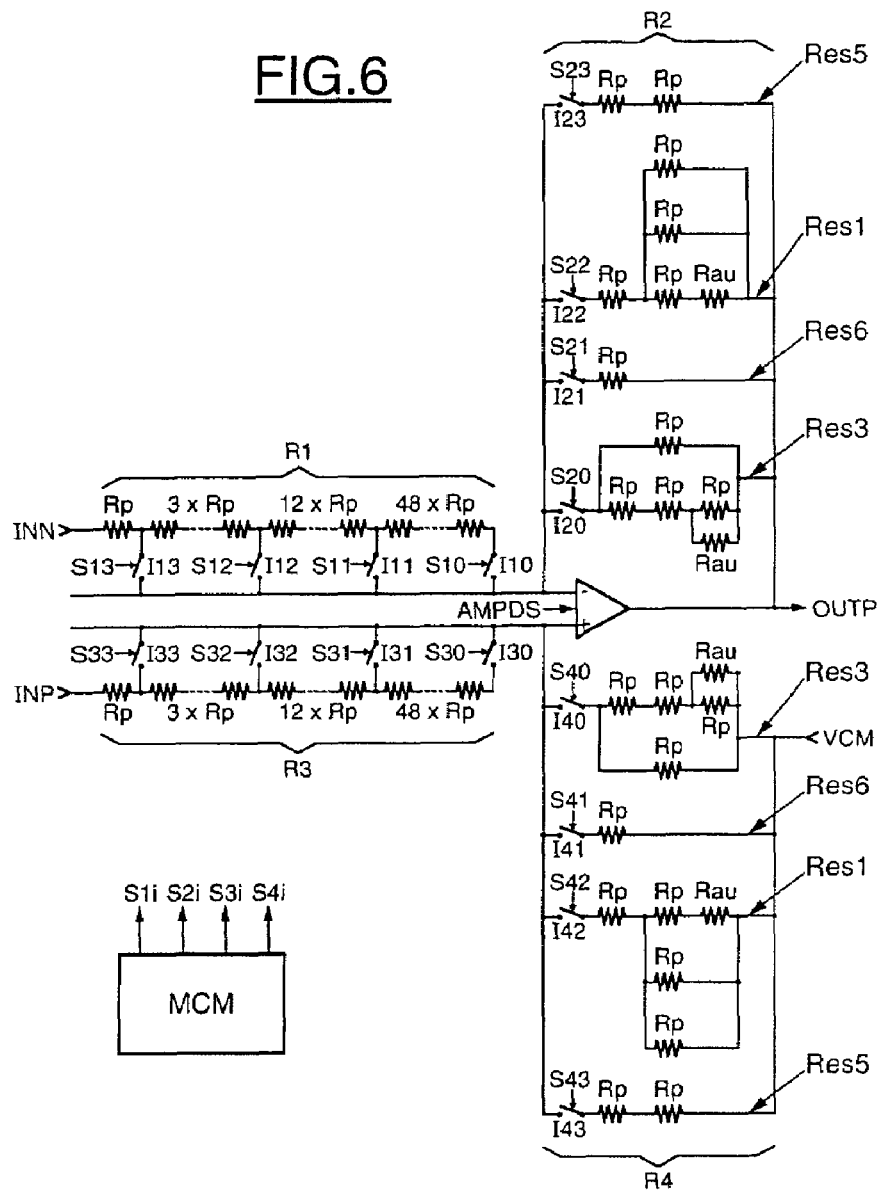

A first exemplary application of the primary resistive networks Res1 and Res3, for controlling the gain of an amplifier circuit, is shown in FIGS. 5 and 6.

(i having values 0 to 3) thanks to a control means MCM delivering control signals S1$i$ and S3$i$, respectively.

The switches I1$i$ and I3$i$ can be formed by controlled transistors.

Furthermore, control means MCM can be designed using logic circuits.

The resistances R2 and R4 are identical and each formed from four primary resistive networks in parallel. Each of these networks can be selected or not by means of a switch, respectively the switches I2$i$ for the networks forming R2, and I4$i$ for the networks forming R4. These switches are controlled respectively by the signals S2$i$ and S4$i$ delivered by the gain control means MCM.

The first network forming R2 or R4 is a resistive network according to the network Res3. The second network Res6 is a main resistance Rp. The third network is a resistive network Res1. The last network Res5 comprises two main resistances Rp in series.

The opening or the closing of the switches I1$i$, I2$i$, I3$i$ and I4$i$ allows the gain of the circuit to be varied in steps of three decibels. The table below illustrates the way to obtain, for example, a gain between −39 decibels and 6 decibels.

| I10 | I11 | I12 | I13 | I20 | I21 | I22 | I23 | Gain [dB] |
|---|---|---|---|---|---|---|---|---|
| Closed | Closed | Closed | Open | Closed | Closed | Closed | Open | 6 |
| Closed | Closed | Closed | Open | Closed | Closed | Open | Closed | 3 |
| Closed | Closed | Closed | Open | Closed | Open | Closed | Closed | 0 |
| Closed | Closed | Closed | Open | Open | Closed | Closed | Closed | −3 |
| Closed | Closed | Open | Closed | Closed | Closed | Closed | Open | −6 |
| Closed | Closed | Open | Closed | Closed | Closed | Open | Closed | −9 |
| Closed | Closed | Open | Closed | Closed | Open | Closed | Closed | −12 |
| Closed | Closed | Open | Closed | Open | Closed | Closed | Closed | −15 |
| Closed | Open | Closed | Closed | Closed | Closed | Closed | Open | −18 |
| Closed | Open | Closed | Closed | Closed | Closed | Open | Closed | −21 |
| Closed | Open | Closed | Closed | Closed | Open | Closed | Closed | −24 |
| Closed | Open | Closed | Closed | Open | Closed | Closed | Closed | −28 |
| Open | Closed | Closed | Closed | Closed | Closed | Closed | Open | −30 |
| Open | Closed | Closed | Closed | Closed | Closed | Open | Closed | −33 |
| Open | Closed | Closed | Closed | Closed | Open | Closed | Closed | −36 |
| Open | Closed | Closed | Closed | Open | Closed | Closed | Closed | −39 |

FIG. 5 illustrates an integrated circuit comprising a single-output differential operational amplifier AMPDS.

An input resistance R1 is connected in the negative input of the amplifier AMPDS. Similarly, a resistance R3 is connected in the positive input of the amplifier AMPDS. In addition, a resistance R4 is connected between the common-mode voltage VCM and the positive input of the amplifier AMPDS.

The output voltage of the integrated circuit is delivered by the output OUTP of the amplifier AMPDS. A negative feedback loop connects the output OUTP of the amplifier AMPDS to its negative input. This negative feedback loop comprises a resistance R2. The values of the four resistances of the integrated circuit are adjustable such that the gain of the amplifier circuit can be modified. Indeed, the gain is equal to R2/R1 (=R4/R3).

FIG. 6 describes more precisely the resistive networks used to form the resistances R1, R2, R3 and R4 of the circuit.

The resistances R1 and R3 are identical and formed from four distinct networks of main resistances Rp mounted in series. These four networks respectively comprise one, three, twelve and forty-eight main resistances Rp. These networks can be selected by operating switches I1$i$ and I3$i$ Given the symmetry of the circuit, the state of the switches I1$i$ and I2$i$ is respectively the same as that of the switches I3$i$ and I4$i$.

Figure 7:
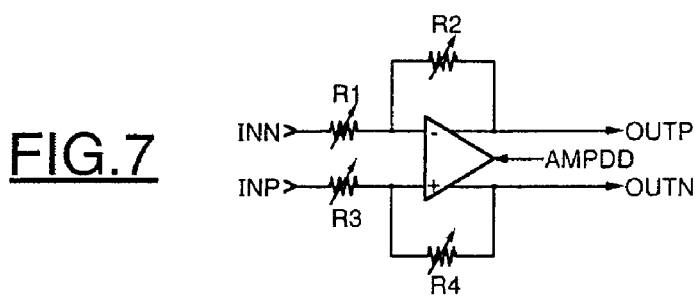
Figure 8:
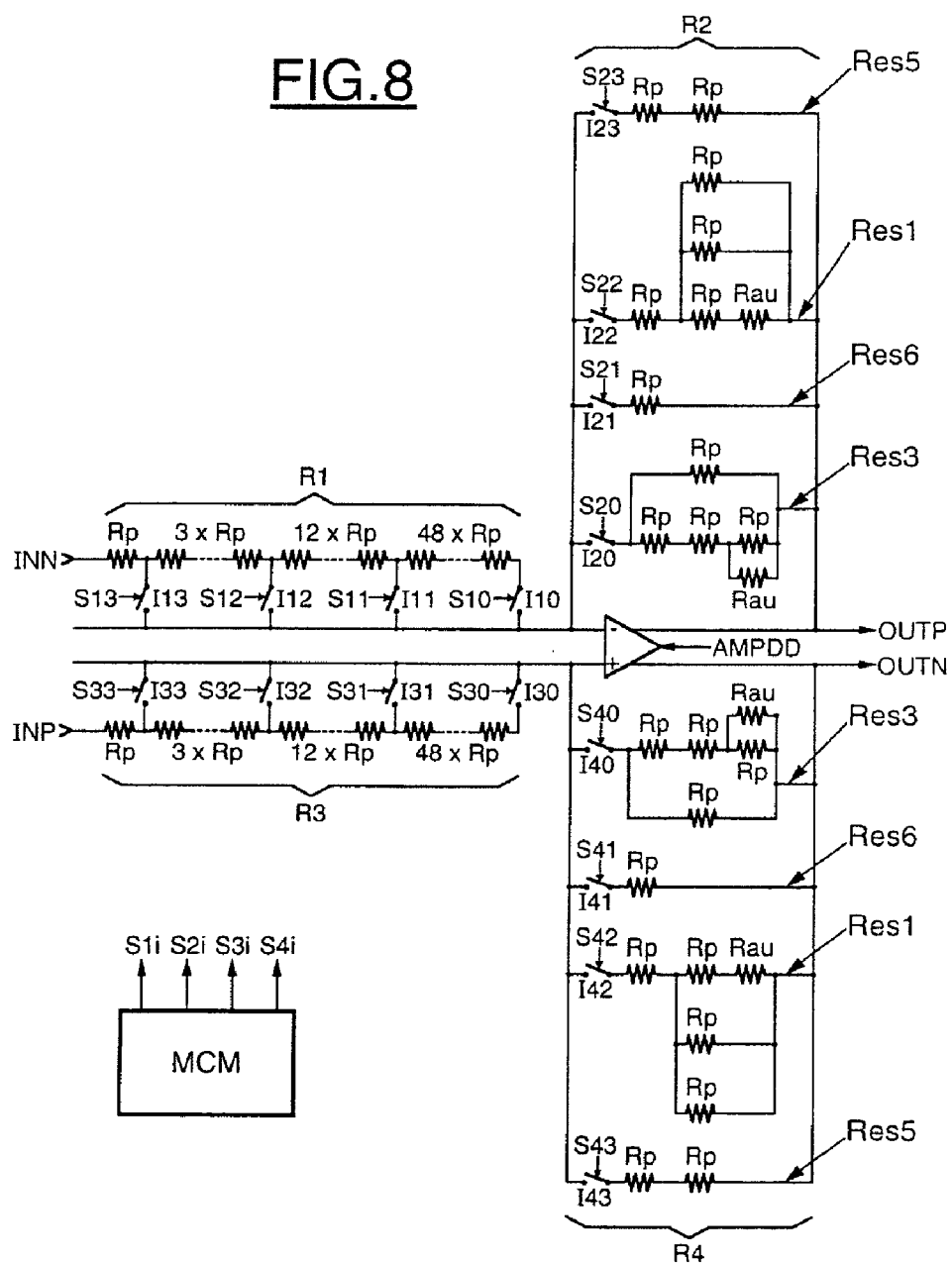

FIGS. 7 and 8 differ from FIGS. 5 and 6 only by the fact that the differential operational amplifier AMPDD has a differential output.

Also, apart from the connection of the resistance R4, the structure is analogous to that in FIGS. 5 and 6.

The operation is also identical to that described with reference to FIGS. 5 and 6.

While there has been illustrated and described what is presently considered to be embodiments of the present invention, it will be understood by those of ordinary skill in the art that various other modifications may be made, and equivalents may be substituted, without departing from the true scope of the present invention.

Additionally, many modifications may be made to adapt a particular situation to the teachings of the present invention without departing from the central inventive concept described herein. Furthermore, an embodiment of the present invention may not include all of the features described above. Therefore, it is intended that the present invention not be limited to the particular embodiments disclosed, but that the invention include all embodiments falling within the scope of the appended claims.

What is claimed is:

1. An integrated circuit comprising:
   a resistive circuit with reduced mismatch that comprises:
   a primary resistive network with several main resistances each having the same theoretical main value; and
   an auxiliary resistance having an auxiliary theoretical resistive value equal to the theoretical main resistive value multiplied or divided by $\sqrt{2}$, all the several main resistances and the auxiliary resistance being connected together so as to attribute a theoretical overall resistive value to the primary resistive network equal to the theoretical auxiliary resistive value.

2. The integrated circuit according to claim 1, wherein: the primary resistive network comprises a main resistance, being one of the several main resistances, in series with a subnetwork having three branches mounted in parallel, each of the branches of the subnetwork comprising a main resistance and one of the branches comprising, aside from a main resistance, an auxiliary resistance mounted in series with the main resistance, the theoretical auxiliary resistive value being equal to the theoretical main resistive value multiplied by $\sqrt{2}$.

3. The integrated circuit according to claim 2, wherein the auxiliary resistance is formed, at least once, by an auxiliary resistive network that is identical to a primary resistive network.

4. The integrated circuit according to claim 1, wherein the resistive circuit comprises several primary resistive networks connected in parallel and/or in series.

5. The integrated circuit according to claim 1, wherein it also comprises a variable-gain operational amplifier whose negative feedback loop comprises at least one resistive circuit with reduced mismatch, switching means for at least one of activating and deactivating the various primary resistive networks of the resistive circuit, and gain control means for controlling the switching means as a function of the desired value of gain.

6. The integrated circuit according to claim 1, wherein: the primary resistive network comprises a main resistance, being one of the several main resistances, in parallel with a subnetwork formed by three main resistances mounted in series, the subnetwork also comprising an auxiliary resistance, mounted in parallel with one of the main resistances of the subnetwork, the theoretical auxiliary resistive value being equal to the theoretical main resistive value divided by $\sqrt{2}$.

7. The integrated circuit according to claim 6, wherein the auxiliary resistance is formed, at least once, by an auxiliary resistive network that is identical to a primary resistive network.

8. The integrated circuit according to claim 6, wherein the resistive circuit comprises several primary resistive networks connected in parallel and/or in series.

9. The integrated circuit according to claim 6, wherein it also comprises a variable-gain operational amplifier whose negative feedback loop comprises at least one resistive circuit with reduced mismatch, switching means for at least one of activating and deactivating the various primary resistive networks of the resistive circuit, and gain control means capable of controlling the switching means as a function of a desired value of gain for the variable-gain operational amplifier.

10. An integrated circuit comprising:
    a circuit supporting substrate;
    a resistive circuit disposed on the circuit supporting substrate, the resistive circuit comprises:
      a primary resistive network with several main resistances each having the same theoretical main value; and
      an auxiliary resistance having an auxiliary theoretical resistive value equal to the theoretical main resistive value multiplied or divided by $\sqrt{2}$, all the several main resistances and the auxiliary resistance being connected together so as to attribute a theoretical overall resistive value to the primary resistive network equal to the theoretical auxiliary resistive value; and
    a variable-gain operational amplifier disposed on the circuit supporting substrate, a negative feedback loop of the variable-gain operational amplifier comprising:
      the resistive circuit;
      switching means for selectively at least one of activating and deactivating the primary resistive network of the resistive circuit, and
      gain control means for controlling the switching means as a function of a desired value of gain for the variable-gain operational amplifier.

11. The integrated circuit according to claim 10, wherein: the primary resistive network comprises a main resistance, being one of the several main resistances, in parallel with a subnetwork formed by three main resistances mounted in series, the subnetwork also comprising an auxiliary resistance, mounted in parallel with one of the main resistances of the subnetwork, the theoretical auxiliary resistive value being equal to the theoretical main resistive value divided $\sqrt{2}$.

* * * * *